(12) United States Patent
Tien et al.

(10) Patent No.: US 8,138,559 B2
(45) Date of Patent: Mar. 20, 2012

(54) RECESSED DRIFT REGION FOR HVMOS BREAKDOWN IMPROVEMENT

(75) Inventors: William Wei-Yuan Tien, Hsin-Chu (TW); Fu-Hsin Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1306 days.

(21) Appl. No.: 11/732,468

(22) Filed: Apr. 3, 2007

(65) Prior Publication Data

US 2008/0246083 A1    Oct. 9, 2008

(51) Int. Cl.
*H01L 29/76* (2006.01)
(52) U.S. Cl. ........ 257/408; 257/336; 257/342; 257/344; 257/E29.266; 257/E29.268
(58) Field of Classification Search .................. 257/336, 257/492, 493, 335, 339, 341, 342, 344, 408, 257/E29.266, E29.268
See application file for complete search history.

(56) References Cited

U.S. PATENT DOCUMENTS

| 5,491,099 | A | * | 2/1996 | Hsu | 438/302 |
| 6,124,159 | A | * | 9/2000 | Chu | 438/225 |
| 6,392,274 | B1 | * | 5/2002 | Tung | 257/339 |
| 6,548,874 | B1 | * | 4/2003 | Morton et al. | 257/371 |
| 6,730,962 | B2 | * | 5/2004 | Wu | 257/336 |
| 7,190,036 | B2 | * | 3/2007 | Ko et al. | 257/374 |
| 7,338,847 | B2 | * | 3/2008 | Shaheed et al. | 438/199 |
| 7,485,925 | B2 | * | 2/2009 | Chen | 257/341 |
| 8,004,039 | B2 | * | 8/2011 | Zinn | 257/339 |
| 2005/0275037 | A1 | * | 12/2005 | Chung | 257/374 |
| 2006/0289933 | A1 | * | 12/2006 | Gossner | 257/336 |
| 2009/0039444 | A1 | * | 2/2009 | Suzuki | 257/392 |

\* cited by examiner

*Primary Examiner* — Kiesha Bryant
*Assistant Examiner* — Eric Ward
(74) *Attorney, Agent, or Firm* — Slater & Matsil, L.L.P.

(57) ABSTRACT

A high-voltage metal-oxide-semiconductor (HVMOS) device having increased breakdown voltage and methods for forming the same are provided. The HVMOS device includes a semiconductor substrate; a gate dielectric on a surface of the semiconductor substrate; a gate electrode on the gate dielectric; a source/drain region adjacent and horizontally spaced apart from the gate electrode; and a recess in the semiconductor substrate and filled with a dielectric material. The recess is between the gate electrode and the source/drain region, and is horizontally spaced apart from the gate electrode.

20 Claims, 7 Drawing Sheets

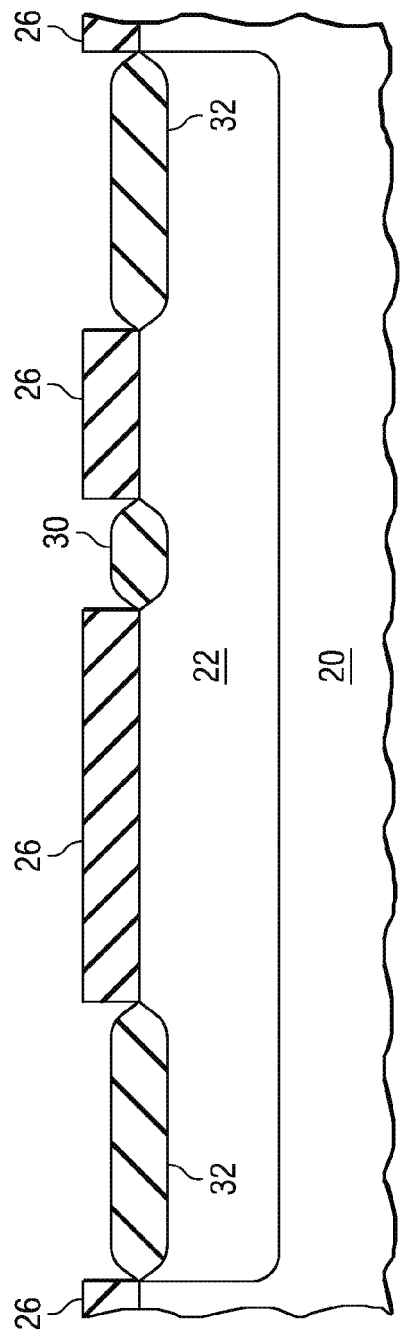
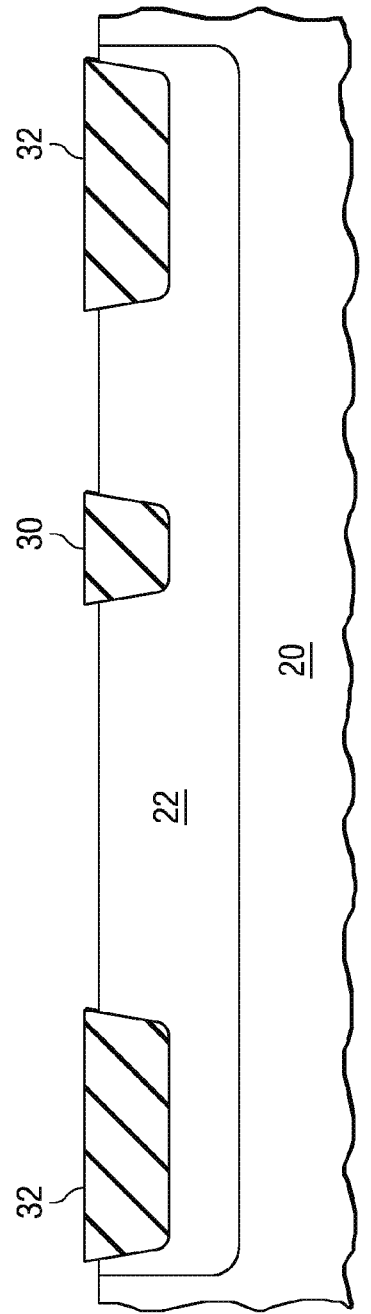
FIG. 3A
FIG. 3B

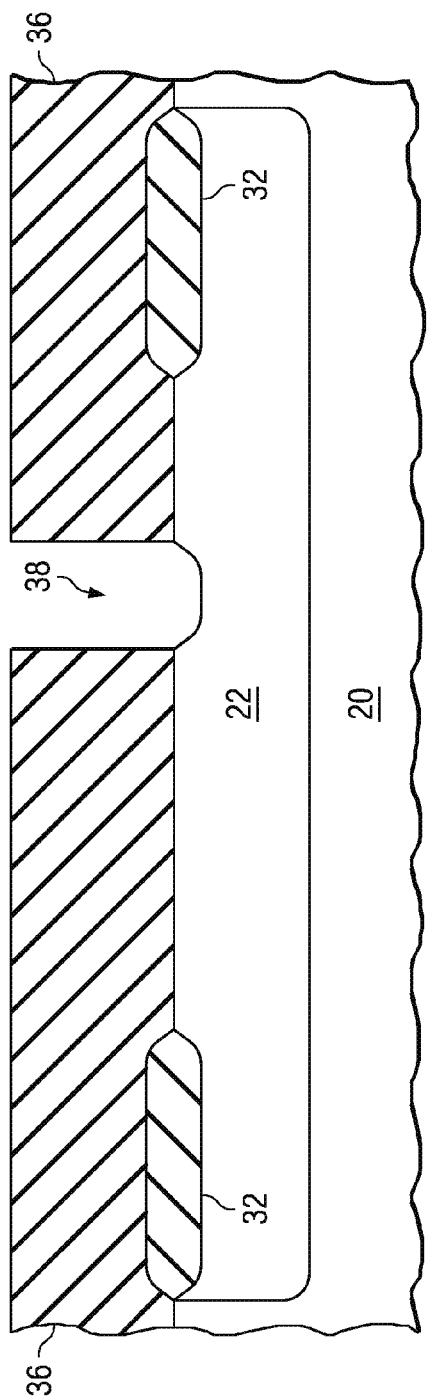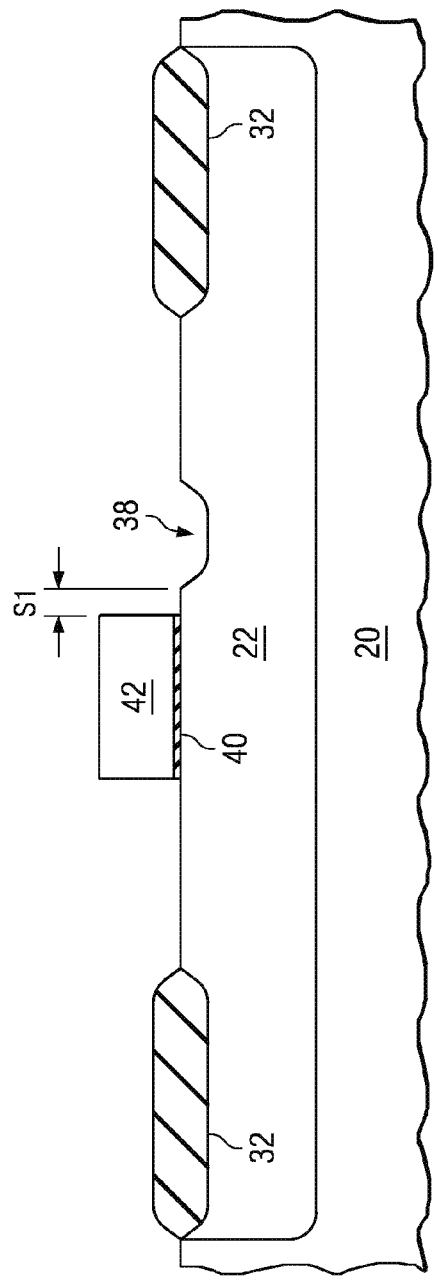

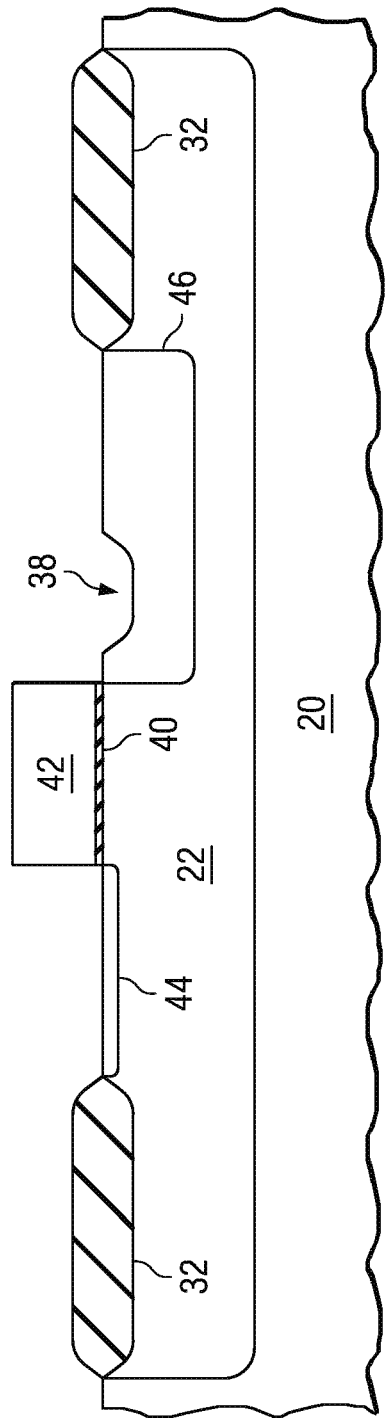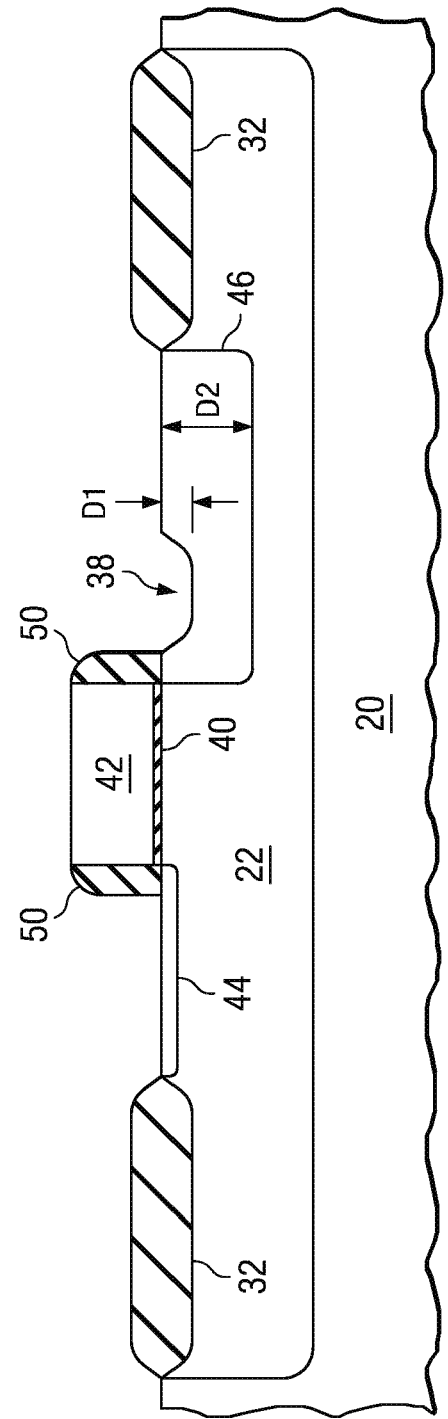

RECESSED DRIFT REGION FOR HVMOS BREAKDOWN IMPROVEMENT

TECHNICAL FIELD

This invention relates generally to semiconductor devices, and more particularly to metal-oxide-semiconductor (MOS) devices, and even more particularly to structures and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc. There are a variety of forms of HVMOS devices. For example, a symmetric HVMOS device may have a symmetric structure on the source side and drain side, and high voltage can be applied on both drain and source sides. An asymmetric HVMOS device may have asymmetric structures on the source side and drain side. For example, only one of the source side and drain side, typically the drain side, is designed for sustaining high voltages.

FIG. 1 illustrates a conventional high-voltage MOS device 2, which is also referred to as double-diffused drain (DDD) MOS device 2. DDD MOS device 2 includes gate oxide 10 on P-well region 16, gate electrode 12 on gate oxide 10, and gate spacer 8 on sidewalls of the gate oxide 10 and gate electrode 12. Lightly doped drain region 4 is formed on the drain side and substantially aligned with an edge of gate electrode 12. Heavily doped drain region 6 is formed in the lightly doped drain region 4, and is spaced apart from the edge of gate spacer 8. Source region 14 is heavily doped. The space between the heavily doped drain region 6 and the edge of gate electrode 12 results in an increase in the drain-to-gate breakdown voltage.

Breakdown voltage is a key parameter of HVMOS devices. Increasing breakdown voltage without the cost of additional mask layers is one of the major goals in the design of HVMOS devices. Typically, the breakdown voltage of an HVMOS device is related to its size. For example, the improvement in the breakdown voltage of the structure shown in FIG. 1 may be achieved by increasing the distance between heavily doped drain region 6 and gate electrode 12. However, such improvement requires more chip space. MOS devices having greater sizes often have greater power consumption. Therefore, increasing breakdown voltage by enlarging the size of the HVMOS device is not a desirable design approach. A new HVMOS structure and formation methods are thus needed.

SUMMARY OF THE INVENTION

In accordance with one aspect of the present invention, a semiconductor structure includes a semiconductor substrate; a gate dielectric on a surface of the semiconductor substrate; a gate electrode on the gate dielectric; a source/drain region adjacent and horizontally spaced apart from the gate electrode; and a recess in the semiconductor substrate and filled with a dielectric material. The recess is between the gate electrode and the source/drain region, and is horizontally spaced apart from the gate electrode.

In accordance with another aspect of the present invention, a semiconductor structure includes a substrate; a gate dielectric on a surface of the substrate; a gate electrode on the gate dielectric; a well region of a first conductivity type underlying the gate electrode and extending beyond edges of the gate electrode; a lightly doped region of a second conductivity type opposite the first conductivity type in the well region, wherein the lightly doped region has an edge adjacent an edge of the gate electrode; a heavily doped region of the second conductivity type in the lightly doped region; and a dielectric region in the lightly doped region and horizontally spaced apart from the gate electrode, wherein the dielectric region is between the gate electrode and the heavily doped region.

In accordance with yet another aspect of the present invention, a semiconductor structure includes a substrate; a well region of a first conductivity type in the substrate; a gate dielectric on a surface of the well region; a gate electrode on the gate dielectric; a gate spacer on a sidewall of the gate electrode; a lightly doped region of a second conductivity type opposite the first conductivity in the well region, wherein the lightly doped region has an edge substantially aligned to an edge of the gate electrode; a heavily doped region of the second conductivity type in the lightly doped region; and a recess in the lightly doped region and between the gate electrode and the heavily doped region. The recess is filled with a dielectric material and has an inner edge substantially aligned with an outer edge of the gate spacer.

In accordance with yet another aspect of the present invention, a method of forming a semiconductor structure includes providing a semiconductor substrate; forming a gate dielectric on a surface of the semiconductor substrate; forming a gate electrode on the gate dielectric; forming a source/drain region adjacent the gate electrode; and recessing the semiconductor substrate to form a recess horizontally spaced apart from the gate electrode. The recess is between the gate electrode and the source/drain region. The method further includes filling the recess with a dielectric material.

In accordance with yet another aspect of the present invention, a method of forming a semiconductor structure includes providing a substrate; forming a well region of a first conductivity type in the substrate; forming a first insulating region and a second insulating region in the well region; removing the first insulating region to form a recess in the well region; forming a lightly doped region of a second conductivity type opposite the first conductivity type in the well region, wherein the recess is in the lightly doped region; forming a heavily doped region of the second conductivity type in the lightly doped region, wherein the heavily doped region is adjacent the recess; forming a gate dielectric on a surface of the well region and adjacent the recess, wherein the gate dielectric is on an opposite side of the recess than the heavily doped region; forming a gate electrode on the gate dielectric; and filling a dielectric material into the recess.

The embodiments of the present invention have increased breakdown voltages.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 9 are cross-sectional views of intermediate stages in the manufacturing of a DDD NMOS device;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 2 through 9. Variations of the preferred embodiments are then discussed. Throughout the various views and illustrative embodiments of the present invention, like reference numbers are used to designate like elements.

Figure 1:
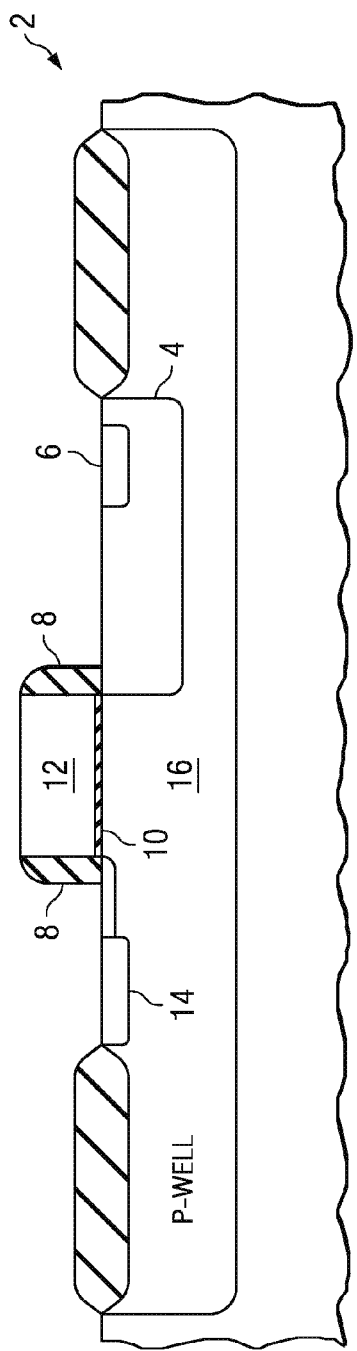
FIG. 1 illustrates a conventional double-diffused drain (DDD) metal-oxide-semiconductor (MOS) device.
Figure 2:
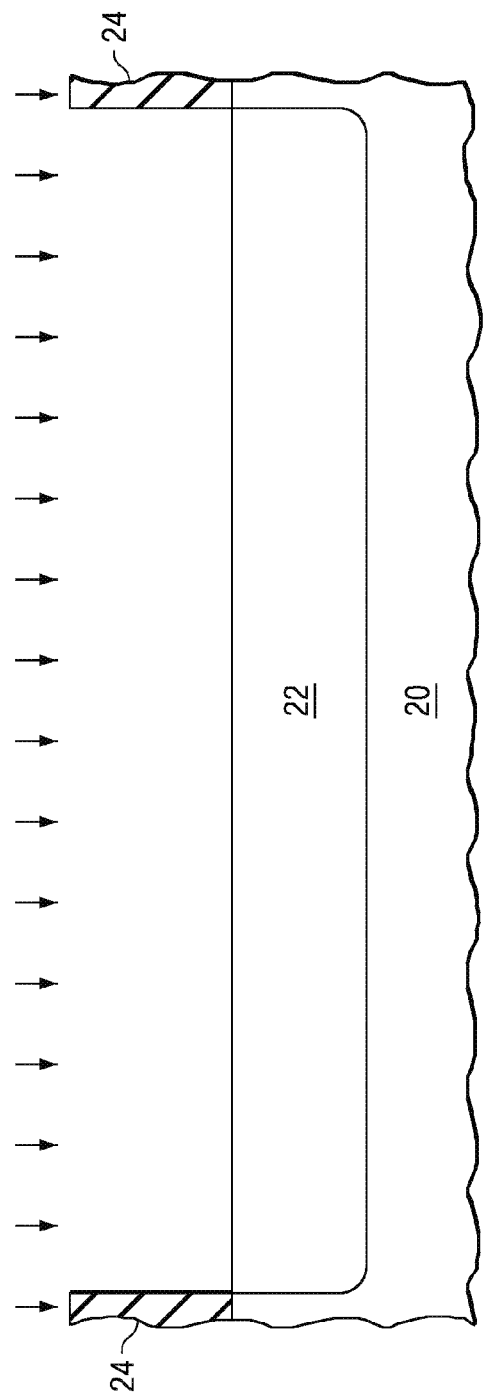

FIG. 2 illustrates substrate 20, which is preferably formed of a semiconductor material such as silicon, although other semiconductor materials may be used. Substrate 20 is preferably of p-type. Alternatively, it may be doped with n-type impurities.

Photoresist 24 is formed on substrate 20 and patterned using lithography techniques. With the masking of photoresist 24, p-well region 22 is formed in substrate 20, preferably by implanting a p-type impurity, such as boron and/or indium. Alternatively, p-well region 22 is formed by epitaxially growing a semiconductor layer on the top surface of substrate 20, and in-situ doping p-type impurities to a desired concentration. In yet other embodiments, the epitaxially grown semiconductor layer is in-situ doped with n-type impurities, and a p-type impurity implantation is performed to neutralize the n-type impurities and to form p-well region 22.

FIGS. 3A and 3B illustrate the formation of insulating regions 30 and 32. In the preferred embodiment, as is shown in FIG. 3A, mask layer 26, preferably formed of SiN, is formed over p-well region 22. Mask layer 26 is then patterned to form openings, exposing underlying p-well region 22. An oxidation is then performed, and insulating regions (also referred to as field oxides throughout the description) 30 and 32 are formed in openings. Preferably, the oxidation process includes thermal oxidation, also referred to as local oxidation of silicon (LOCOS). Thus, insulating regions 30 and 32 may be referred to as field oxide regions. An advantageous feature of the field oxide regions 30 and 32 is that they have rounded profiles at their bottom corners.

In other embodiments, as shown in FIG. 3B, insulating regions 30 and 32 are formed by forming trenches in p-well region 22, filling the trenches with a dielectric material, such as $SiO_2$ or high-density plasma (HDP) oxide, and performing a chemical mechanical polish to remove excess dielectric material. The resulting shallow trench isolation (STI) regions are insulating regions 30 and 32. Thus, insulating regions 30 and 32 may be referred to as STI regions. Preferably, the formation of the trenches is tuned, so that the bottom profile of STI region 30 is rounded with no sharp corners.

FIG. 4 illustrates the removal of insulating region 30. In an exemplary embodiment, a mask such as photoresist 36 is formed and patterned, exposing field oxide region 30. Field oxide region 30 is then removed. In an embodiment wherein field oxide region 30 is formed of silicon oxide, diluted phosphorous acid is used to etch field oxide region 30, leaving recess 38 in p-well region 22.

In alternative embodiments, instead of forming and then removing insulating region 30, recess 38 may be formed by forming a mask to cover substrate 20 and field oxide region 32, and etching exposed substrate 20. Again, it is preferred to adjust the etching process so that recess 38 has a rounded bottom profile. Optionally, after the formation of recess 38, a step for rounding the bottom profile may be performed, wherein the rounding step may be performed using wet oxide etch.

Referring to FIG. 5, a gate stack including gate dielectric 40 and gate electrode 42 is formed on the surface of p-well region 22. Preferably, gate dielectric 40 is formed of silicon oxide, and gate electrode 42 is formed of polysilicon, although other materials commonly used for high-voltage gate stacks can also be used. As is known in the art, gate dielectric 40 may be formed of oxides, nitrides, high-k dielectric materials, and the like. Gate electrode 42 may be formed of polysilicon, metals, metal silicides, metal nitrides, and combinations thereof. The formation of the gate stack is well known in the art, and thus the process steps are not repeated herein.

Gate electrode 42 and recess 38 have distance S1. In the preferred embodiment, distance S1 is substantially equal to the thickness of the subsequently formed gate spacer, and thus recess 38 substantially joins the gate spacer. In another embodiment, distance S1 is greater than the thickness of gate spacer, so that recess 38 is spaced apart from the gate spacer. More details are provided in subsequent paragraphs.

FIG. 6 illustrates the formation of lightly doped source region 44 and lightly doped drain region 46, which is alternatively referred to as drift region 46. Preferably, lightly doped source region 44 is implanted with, and thus shares a same mask with, the formation of lightly doped source/drain regions (LDD) of low-voltage MOS devices. Lightly doped drain region 46, on the other hand, may need a separate mask. Preferably, lightly doped drain region 46 has depth D2, greater than depth D1 of recess 38. More preferably, depth D1 of recess 38 is between about 10 percent and about 50 percent of depth D2. Even more preferably, depth D1 is about 50 percent of D2. In an exemplary embodiment, depth D2 is between about 10 nm and about 100 nm. Furthermore, depth D2 of lightly doped drain region 46 is substantially greater than the depth of lightly doped source region 44.

Lightly doped source region 44 and lightly doped drain region 46 comprise n-type impurities, such as phosphorous, arsenic, and combinations thereof, with a dopant concentration higher than the dopant concentration in p-well region 22.

In the previously discussed embodiments, lightly doped source/drain regions 44 and 46 are formed after the formation of field oxide region 32 and recess 38. Alternatively, the order for forming lightly doped source/drain regions 44 and 46 and for forming field oxide region 32 and recess 38 may be reversed. One skilled in the art will realize the corresponding process details.

FIG. 7 illustrates the formation of gate spacers 50. As is known in the art, gate spacers 50 are preferably formed by blanket depositing a dielectric layer and etching undesired portions of the dielectric layer. Gate spacers 50 may comprise a single layer, or have a composite structure with, for example, a nitride-on-oxide structure or an oxide-nitride-oxide (ONO) structure. For better results, the distance between drain side gate spacer 50 and recess 38 is preferably less than about 300 nm. Even more preferably, as discussed in the preceding paragraphs, the outer edge of the drain side gate spacer 50 is substantially aligned to the inner edge of recess 38, although they may be spaced apart from each other, as shown by the dashed line 51 indicating the outer edge of the drain side spacer 50.

Figure 8:
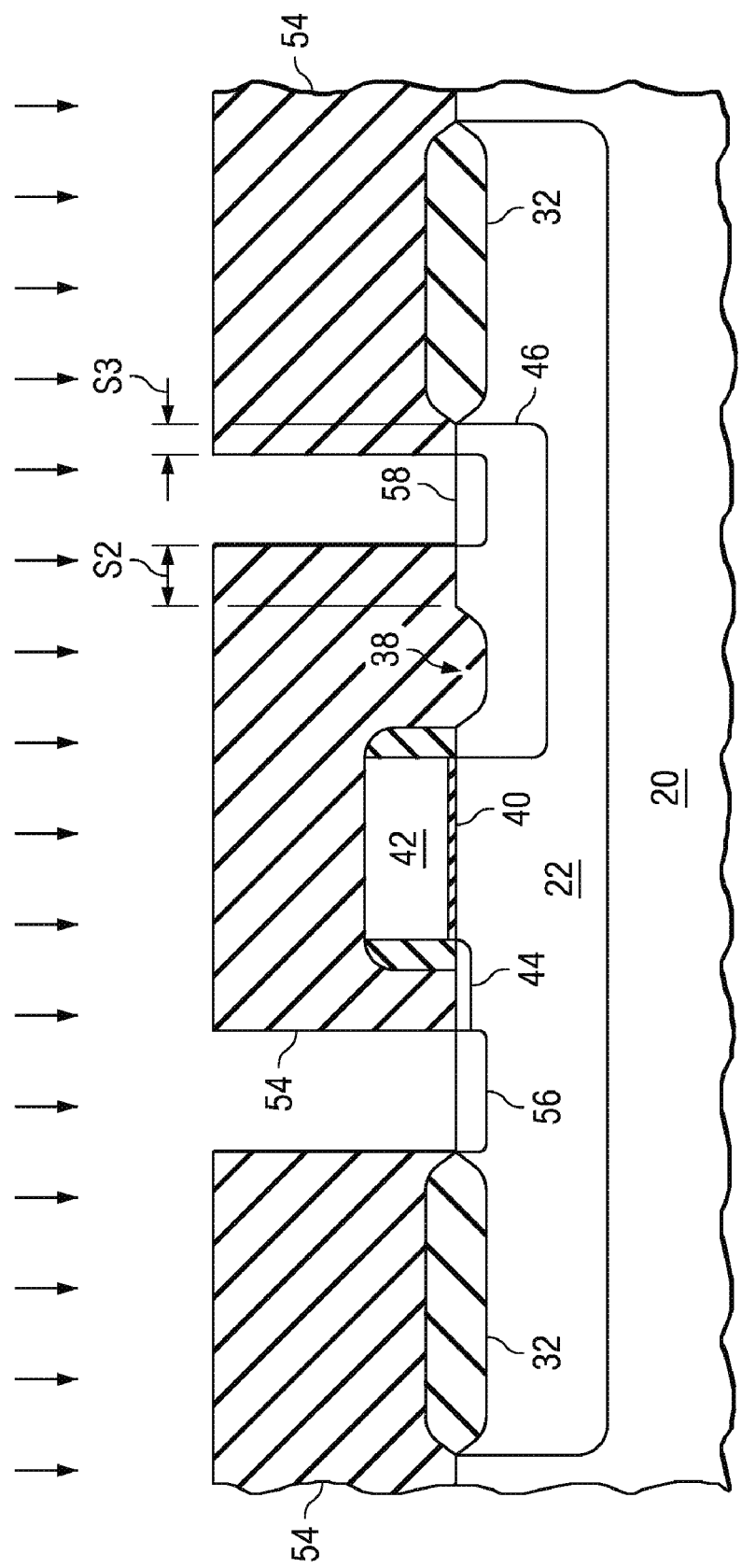

Referring to FIG. 8, photoresist 54 is formed, and source region 56 and drain region 58 are formed by implanting n-type impurities. Source/drain regions 56 and 58 are preferably doped to a high impurity concentration, for example, greater than about $5E20/cm^3$, and hence are also referred to as N+ regions.

Drain region 58 is preferably spaced apart from recess 38. In an exemplary embodiment, distance S2 is between about 500 nm and about 3000 nm. Alternatively, drain region 58 may substantially join recess 38. However, it is not preferred to formed a portion of or entire drain region 58 under recess 38, as such a structure may cause the decrease in the breakdown voltage of the resulting double-diffused drain (DDD) MOS device. Drain region 58 may be spaced apart from, or adjoin, the drain side field oxide 32, provided that no breakdown occurs between drain region 58 and diffusion regions (not shown) on the other side of the respective field oxide region 32. In an exemplary embodiment, distance S3, which is between drain region 58 and the respective field oxide region 32, is greater than about 300 nm.

Figure 9:
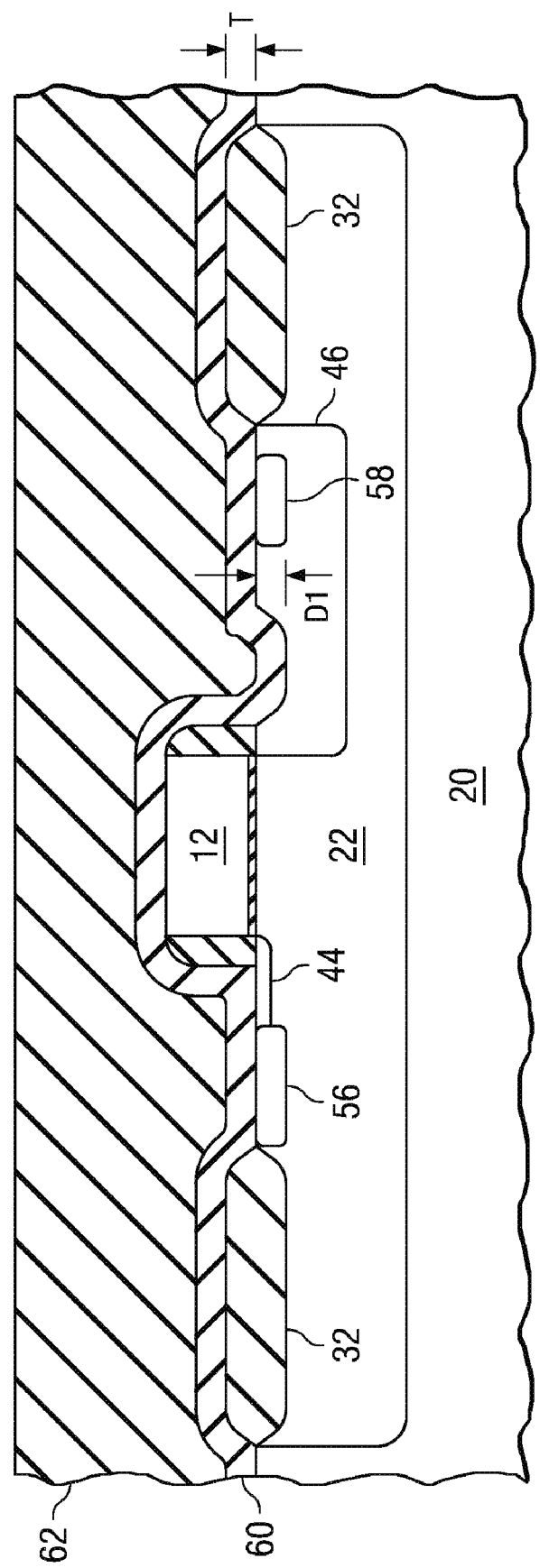

FIG. 9 illustrates the formation of contact etch stop layer (CESL) 60 and inter-layer dielectric (ILD) 62. Preferably, CESL 60 has a thickness T greater than depth D1 of recess 38, and hence recess 38 is filled with CESL 60. Alternatively, thickness T of CESL 60 is less than depth D1 of recess 38, and hence recess 38 is filled with CESL 60 and ILD 62.

In the embodiments discussed in the preceding paragraphs, lightly doped source/drain regions 44 and 46, source region 56 and drain region 58, gate dielectric 40, gate electrode 42 and gate spacers 50 may be formed simultaneously with the corresponding components of low-voltage MOS devices. The manufacturing cost is thus reduced.

Figure 10:
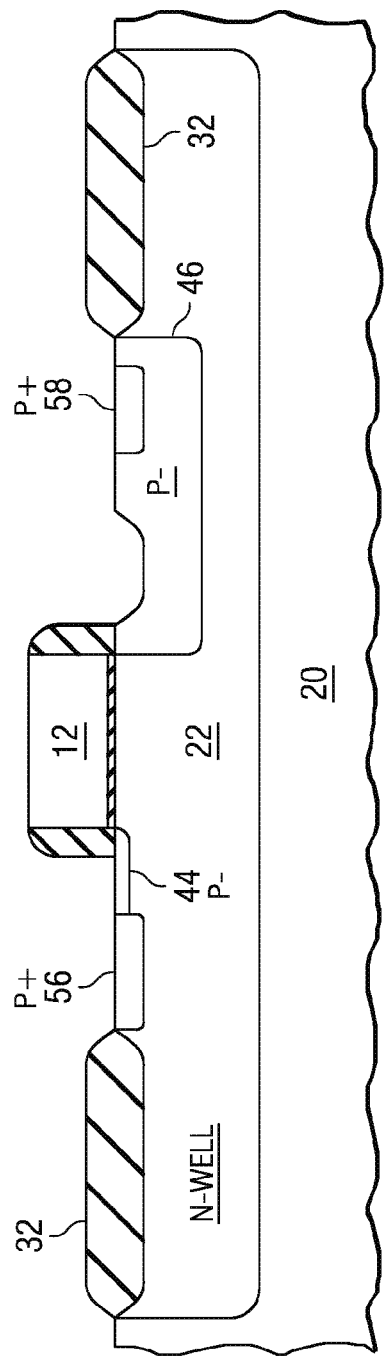
FIG. 10 illustrates a cross-sectional view of a DDD PMOS device.

Although the preferred embodiments illustrate the formation of a DDD NMOS device, one skilled in the art will realize the respective formation steps for forming DDD PMOS devices, with the conductivity type of well region 22, lightly doped source/drain regions 44 and 46, source region 56, drain region 58, etc., reversed. An exemplary illustrative embodiment is shown in FIG. 10.

Figure 11:
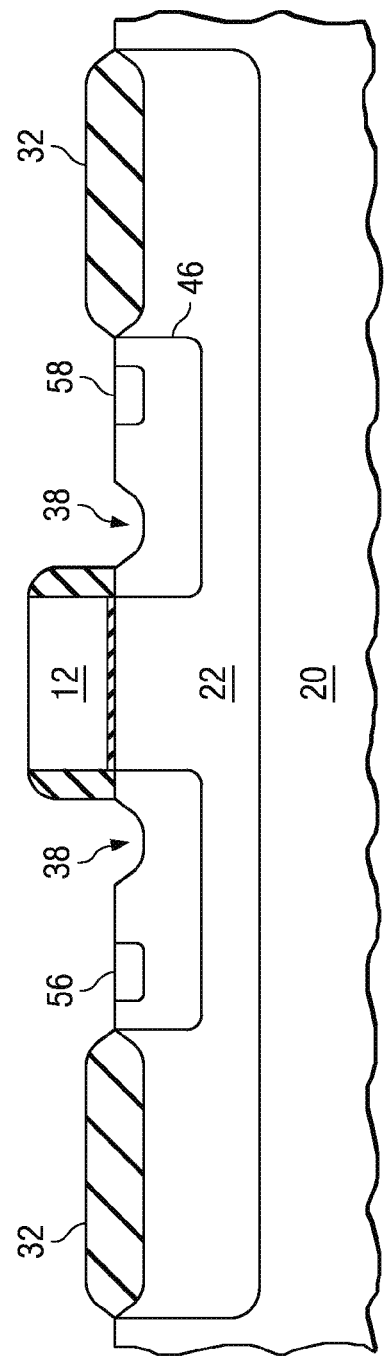
FIG. 11 illustrates a symmetric DDD MOS device.

The previously illustrated embodiments have asymmetric structures, wherein source and drain sides have different structures. FIG. 11 illustrates an embodiment having a symmetric structure, and recess 38 is formed between gate electrode 12 and each of the source region 56 and drain region 58. The source side of the symmetric DDD MOS device may have essentially the same, or substantially different, specifications as the drain side, depending on design requirements.

The embodiments of the present invention have several advantageous features. Since recess 38 is filled with a dielectric material, currents have to take a path under recess 38, the formation of recess 38 is thus equivalent to extending the distance between drain region 58 and gate electrode 12. As a result, the breakdown voltage is increased. Such an improvement is obtained without the penalty of increasing the size of the resulting DDD MOS device. Simulation results have revealed that the breakdown voltages of the embodiments of the present invention are increased by about 15 percent over conventional DDD MOS devices with substantially flat substrate surfaces between drain regions and respective gate electrodes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor substrate;
a gate dielectric on a surface of the semiconductor substrate;
a gate electrode on the gate dielectric;
a source/drain region adjacent and horizontally spaced apart from the gate electrode;
a recess in the semiconductor substrate and filled with a dielectric material, wherein the recess is between the gate electrode and the source/drain region, wherein the recess is horizontally spaced apart from the gate electrode, and wherein the recess and the source/drain region are not vertically overlapped, and are physically separated from each other; and
a lightly doped source/drain region having a lower impurity concentration than the source/drain region, wherein the lightly doped region is of a same conductivity type as the source/drain region and has an edge substantially aligned with an edge of the gate electrode, and wherein the recess and the source/drain region are in the lightly doped source/drain region.

2. The semiconductor structure of claim 1 further comprising an insulating region adjacent the source/drain region, wherein a depth of the recess is substantially equal to a thickness of the insulating region.

3. The semiconductor structure of claim 2, wherein the insulating region comprises an oxide of the semiconductor substrate.

4. The semiconductor structure of claim 1, wherein the lightly doped source/drain region comprises a portion extending into the space between the recess and the source/drain region, with the source/drain region being physically separated from the recess by the portion of the lightly doped source/drain region.

5. A semiconductor structure comprising:
a substrate;
a gate dielectric on a surface of the substrate;
a gate electrode on the gate dielectric;
a well region of a first conductivity type underlying the gate electrode and extending beyond edges of the gate electrode;
a lightly doped region of a second conductivity type opposite the first conductivity type in the well region, wherein the lightly doped region has an edge adjacent an edge of the gate electrode;
a heavily doped region of the second conductivity type in the lightly doped region;
a recess extending from a top surface of the lightly doped region into the lightly doped region, wherein the recess is horizontally spaced apart from the gate electrode, and is horizontally between the gate electrode and the heavily doped region;
a dielectric region in the recess;
a contact etch stop layer extending over the gate electrode, the lightly doped region, and the heavily doped region, and extending into the recess, wherein a portion of the contact etch stop layer in the recess forms a first portion of the dielectric region, and wherein a bottom surface of the first portion contacts a semiconductor material of the substrate; and an inter-layer dielectric over the contact etch stop layer, wherein the inter-layer dielectric extends into the recess and forms a second portion of the dielectric region.

6. The semiconductor structure of claim 5 further comprising a gate sidewall spacer on a sidewall of the gate electrode, wherein the gate sidewall spacer is laterally between the dielectric region and the gate electrode.

7. The semiconductor structure of claim 6, wherein the gate spacer has an outer edge substantially aligned with an inner edge of the dielectric region.

8. The semiconductor structure of claim 6, wherein the gate spacer has an outer edge spaced apart from an inner edge of the dielectric region.

9. The semiconductor structure of claim 5, wherein the dielectric region has a substantially rounded bottom profile.

10. The semiconductor structure of claim 5, wherein a depth of the dielectric region is between about 10 percent and about 50 percent of a depth of the lightly doped region.

11. The semiconductor structure of claim 5, wherein the dielectric region is spaced apart from the heavily doped region.

12. The semiconductor structure of claim 5 further comprising an insulating region having an inner edge substantially aligned with an outer edge of the lightly doped region, wherein a thickness of the insulating region is substantially equal to a depth of dielectric region.

13. The semiconductor structure of claim 5 further comprising:
an additional heavily doped region of the second conductivity type in the well region wherein the additional heavily doped region is on an opposite side of the gate electrode than the dielectric region, and wherein the heavily doped region is in direct contact with the well region.

14. The semiconductor structure of claim 5 further comprising:
an additional lightly doped region of the second conductivity type in the well region, wherein the additional lightly doped region is on an opposite side of the gate electrode than the dielectric region;
an additional heavily doped region of the second conductivity type in the additional lightly doped region; and
an additional dielectric region in the additional lightly doped region and spaced apart from the gate electrode, wherein the additional dielectric region is between the gate electrode and the additional heavily doped region.

15. The semiconductor structure of claim 5, wherein the lightly doped region comprises a portion extending into the space between the dielectric region and the heavily doped region, with the recess being physically separated from the heavily doped region by the portion of the lightly doped region.

16. A semiconductor structure comprising:
a substrate;
a well region of a first conductivity type in the substrate;
a gate dielectric on a surface of the well region;
a gate electrode on the gate dielectric;
a gate sidewall spacer on a sidewall of the gate electrode;
a lightly doped region of a second conductivity type opposite the first conductivity in the well region, wherein the lightly doped region has an edge substantially aligned to an edge of the gate electrode;
a heavily doped region of the second conductivity type in the lightly doped region; and
a recess in the lightly doped region and between the gate electrode and the heavily doped region, wherein the recess has an inner edge substantially aligned with an outer edge of the gate sidewall spacer, wherein the recess is filled with a dielectric material, and wherein the heavily doped region is spaced apart from the recess.

17. The semiconductor structure of claim 16, wherein the recess has a substantially rounded bottom profile.

18. The semiconductor structure of claim 16, wherein the recess has a substantially same depth as an insulating region adjoining the lightly doped region, wherein the insulating region is selected from the group consisting essentially of a field oxide and a shallow trench isolation region.

19. The semiconductor structure of claim 16 further comprising:
a contact etch stop layer extending over the gate electrode, the lightly doped region, and the heavily doped region, and extending into the recess, wherein a portion of the contact etch stop layer in the recess forms a first portion of the dielectric material, and wherein a bottom surface of the first portion contacts a semiconductor material of the substrate; and
an inter-layer dielectric over the contact etch stop layer, wherein the inter-layer dielectric extends into the recess and forms a second portion of the dielectric material.

20. The semiconductor structure of claim 16, wherein the lightly doped region comprises a portion extending into the space between the recess and the heavily doped region, with the recess being physically separated from the heavily doped region by the portion of the lightly doped region.

* * * * *